United States Patent
Penney et al.

(10) Patent No.: US 10,510,398 B2
(45) Date of Patent: Dec. 17, 2019

(54) SYSTEMS AND METHODS FOR IMPROVING WRITE PREAMBLES IN DDR MEMORY DEVICES

(71) Applicant: Micron Technology, Inc., Boise, ID (US)

(72) Inventors: Daniel B. Penney, Wylie, TX (US); David R. Brown, Lucas, TX (US); Gary L. Howe, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/826,236

(22) Filed: Nov. 29, 2017

(65) Prior Publication Data
US 2019/0164593 A1     May 30, 2019

(51) Int. Cl.
| | |
|---|---|
| G11C 29/02 | (2006.01) |
| G11C 11/4093 | (2006.01) |
| G11C 7/10 | (2006.01) |
| G11C 11/4076 | (2006.01) |

(52) U.S. Cl.
CPC ........ *G11C 11/4093* (2013.01); *G11C 7/1093* (2013.01); *G11C 7/1096* (2013.01); *G11C 11/4076* (2013.01); *G11C 2207/2254* (2013.01)

(58) Field of Classification Search
CPC .................................................. G11C 29/022
USPC ......................................................... 365/193
See application file for complete search history.

(56) References Cited

U.S. PATENT DOCUMENTS

| | | |
|---|---|---|
| 2003/0031082 A1 | 2/2003 | Sawada |
| 2005/0254307 A1 | 11/2005 | Dietrich et al. |
| 2006/0062039 A1 | 3/2006 | Ruckerbauer et al. |
| 2014/0119141 A1* | 5/2014 | Tamlyn ............... G11C 29/022 365/193 |
| 2014/0258607 A1 | 9/2014 | Shim et al. |
| 2015/0063044 A1 | 3/2015 | Byun et al. |

OTHER PUBLICATIONS

PCT/US2018/045038; International Search Report dated Nov. 26, 2018, pp. 1-11.

* cited by examiner

*Primary Examiner* — Jason Lappas
(74) *Attorney, Agent, or Firm* — Fletcher Yoder, P.C.

(57) ABSTRACT

A memory device includes a data write circuitry. The data write circuitry is configured to capture a first write command received via an external input/output (I/O) interface. The data write circuitry is further configured to generate a first internal write start (InternalWrStart) in a data strobe (DQS) domain after capture of the first write command. The data write circuitry is additionally configured to write a first one or more data bits into at least one memory bank based on the first InternalWrStart, wherein the first InternalWrStart is generated internally in the memory device.

13 Claims, 5 Drawing Sheets

SYSTEMS AND METHODS FOR IMPROVING WRITE PREAMBLES IN DDR MEMORY DEVICES

BACKGROUND

Field of the Present Disclosure

The present disclosure relates to circuitry for memory devices, and more specifically, to systems and methods for write preambles that may be used during the writing of data of a memory device, such as a double data rate (DDR) memory device.

Description of Related Art

Random access memory (RAM) devices, such as the ones that may be employed in electrical devices to provide data processing and/or storage, may provide direct availability to addressable data stored in memory circuitry of the device. Certain RAM devices, such as synchronous dynamic RAM (SDRAM) devices may, for example, have multiple memory banks having many addressable memory elements. A strobe-based data bus may be used, in combination with certain strobe signals, to provide read and write access to the addressable memory elements. The data strobe signals (e.g., DQS) may include a programmable preamble portion, a toggling portion, and a postamble portion. The programmable preamble portion may provide for a programmable timing window for the receiving device to enable data capture circuitry while a known/valid level is present on the strobe signal, thus avoiding false triggers of the data capture circuitry. Following the programmable preamble portion and during the toggling portion, the DQS will toggle along with a clock signal (CLK) through high and low transitions to transfer data. Time following the last transition is then known as the postamble portion.

A phase difference between the CLK and DQS strobes (tDQSS) may create a domain crossing problem for the start of write bursts. That is, an activation period of the signal synchronized with the external data strobe signal DQS should be maintained until the internal clock is activated to ensure proper functionality. This domain crossing problem is made worse when write commands are issued so close together that the programmed write preamble is incomplete, which reduces the time window needed to resolve the domain crossing. It would be beneficial to improve techniques for programmable write preambles.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
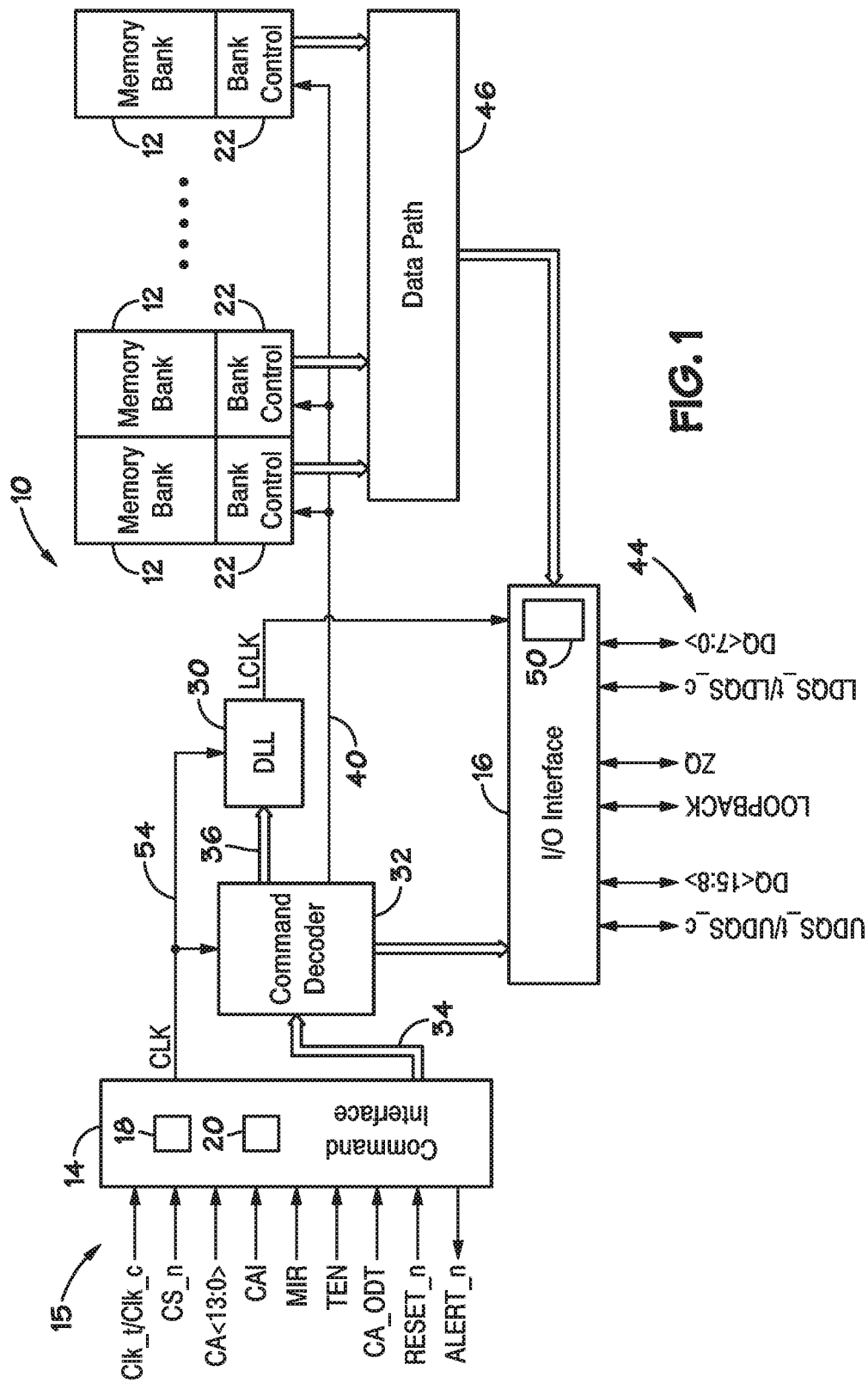
FIG. 1 is a block diagram illustrating an organization of a memory device that may benefit from improved handling of write preambles (e.g., partial preambles), in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) memory devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines useful in saving and retrieving the bits from the memory bank. In operation, a strobe-based data bus may be used to transmit and receive the bits. A strobe signal (e.g., DQS) may be used in conjunction with a clock signal (CLK) to validate that data levels are suitable for communication. As per Joint Electron Device Engineering Council (JEDEC) standards, the DQS includes a programmable preamble portion, a toggling portion, and a postamble portion. The programmable preamble portion provides for a programmable timing window for the receiving device to enable data capture circuitry while a known/valid level is present on the strobe signal. Following the programmable preamble portion and during the toggling portion, the DQS will toggle along with a clock signal (CLK) through high and low transitions to transfer data. Time following the last transition is then known as the postamble portion.

A domain crossing problem for the start of write bursts arises due to a phase difference between the CLK and DQS strobes (tDQSS), which may be acerbated when write commands as part of a write burst are issued so close in time with each other that the programmed preamble is not complete. This domain crossing problem may result in the time window needed to resolve the domain crossing between DQS and CLK domains being unsuitably small. The techniques described herein may eliminate the domain crossing problem, in certain cases, by keeping the start of the write with a partial/no preamble completely in the DQS domain. In certain embodiments, there is no capture of a subsequent write command (WrCmd) following a first WrCmd when two write commands are close together. Instead, a number of DQS cycles are counted from the successful capture of write start (WrStart) by the first WrCmd. Accordingly, the subsequent WrCmd may be started automatically after a proper number of DQS cycles from the first WrStart capture is counted. Because the internal automatic generation of the second WrStart is accomplished entirely from the DQS domain, there would be no problem with phase difference from CLK that would have to be resolved. In this manner the capture of WrStarts may be improved.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

Write circuitry 50 may be used during data writes to keep a start of a write completely in the DQS domain. In certain embodiments, the circuitry 50 does not capture a subsequent write command (WrCmd) following a first WrCmd when two write commands are close together. Instead, a number of DQS cycles are counted from the successful capture of write start (WrStart) by the first WrCmd. Accordingly, the subsequent WrCmd may be started automatically by the circuitry 50 after a proper number of DQS cycles from the first WrStart capture is counted. Because the internal automatic generation of the second WrStart is accomplished entirely from the DQS domain, there is no problem with phase difference from CLK that would have to be resolved. In this manner the capture of WrStart from the CLK domain by DQS may be done only when a full preamble is available to provide for a maximum tDQSS variation, as further described below.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
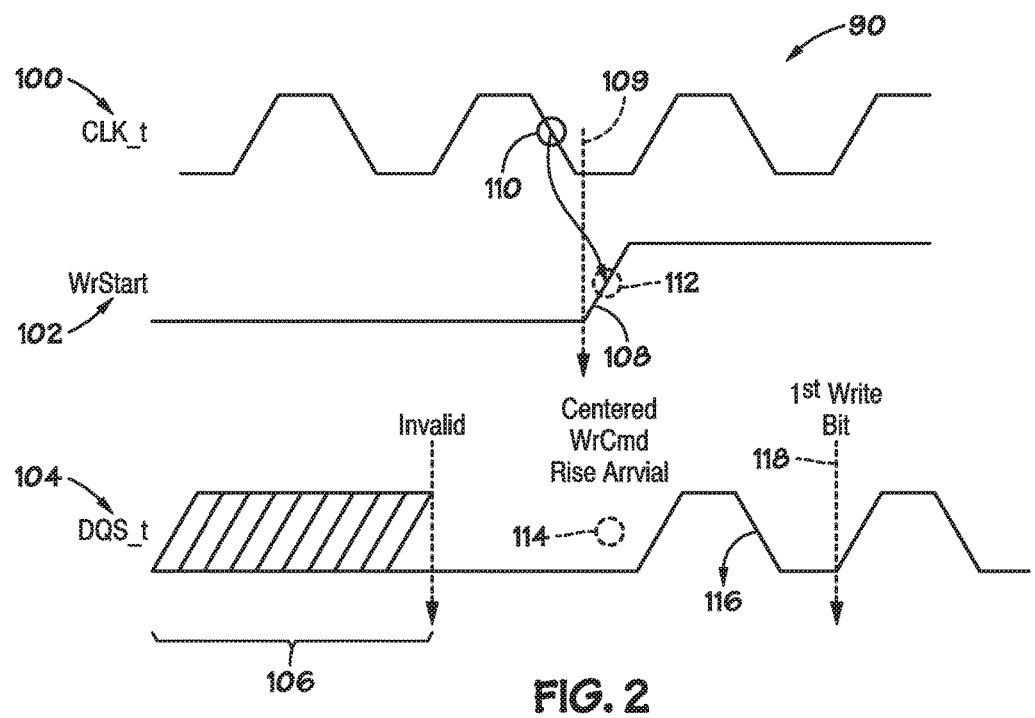
FIG. 2 is a timing diagram illustrating embodiments of a clock (CLK) waveform, a write start waveform, and a data strobe (DQS) waveform.

Turning now to FIG. 2, an example timing diagram 90 illustrating embodiments of a CLK_t waveform 100, a write start (WrStart) waveform 102, and a DQS_t waveform 104 generated using a write preamble (WPre) of 2 cycles, is provided. As illustrated, the CLK_t waveform 100 is a continuous free-running signal, while the DQS_t waveform 104 is not a continuous free-running probe signal. Accordingly, the DQS_t waveform 104 shows a section 106 deemed invalid. As the WrStart waveform 102 is initiated corresponding to a write command (WrCmd) 110, the diagram illustrates the launch of a leading edge 108 starting at time 109 of the WrStart waveform 102 after a CAS Write Latency (CWL) number of cycles from the entry of the WrCmd 110. Column Access Strobe (CAS) latency is the delay time between the moment a memory controller or processor tells the memory module 10 to access a particular memory column on a memory bank 12, and the moment the data from the given array location is available on the I/O interface 16 output pins.

The WrCmd 110 may be captured and CWL-shifted to produce a shifted WrCmd 112, which in the depicted embodiment is launched using CLK_t 100. Therefore, the WrCmd 110 is generated from the clock domain. As mentioned earlier, clock (CLK) is continuous and "free-running". It is desired that the WrStart signal 102 be captured via DQS on the correct cycle in order to begin strobing write data at the DQ input buffers (e.g., included in the I/O interface 16) also on the correct cycle. The capture of WrStart via DQS_t 104 internally may be a difficult timing problem because CLK and DQS signals are not necessarily aligned in phase. Further timing complications are due to DQS not being a continuous, free-running strobe, unlike CLK.

DQS_t 104 is enabled just prior to a write data burst and is driven with a specified "preamble" before beginning to strobe in the write data. The DQS_t 104 preamble may be programmed to different lengths on certain DDR devices. For example, DDR5 currently includes programmable DQS preambles that may be 1, 2, or 3 cycles wide.

In the example depicted in FIG. 2, the DQS_t 104 preamble is programmed to 2 cycles, i.e., WPre=2. Generally, the wider the preamble the wider the target window that may be used for DQS to capture the CLK-generated WrStart signal 102, which may be necessary to overcome wider differences in phase between CLK and DQS. A dashed circle 114 is illustrative of a target center point for the WrStart 102 rise to occur in order to enable a maximum possible positive or negative phase difference between CLK and DQS and still be able to properly capture the WrStart 102 with a correct falling edge 116 of DQS. In the depicted embodiment, the WrStart signal 102 would be captured with the specific DQS_t 104 falling edge 116 in order to begin strobing in the write burst data on the correct cycle. Accordingly, the circle 114 corresponds to the same time as the shifted WrCmd 112. In the depicted example, a first write bit may be captured at time 118, e.g., at the beginning of second DQS_t rise. Indeed, using the techniques described herein as further described below, the domain crossing problem may be eliminated by keeping the WrStart 102 with a partial/no preamble completely in the DQS domain.

It may be beneficial to describe theoretical tDQSS range possibilities for certain write preambles, such as for WPre=2, which may be possible using the techniques describe herein. As mentioned earlier, the tDQSS is a phase difference between the CLK and DQS strobes. In other words, the tDQSS is the time allowance that a controller has in order to vary DQS phase with respect to CLK and still provide for writeable data, or the degree of tolerance to misalignment (skew) between DQS and CLK. If out of tolerance, data may not be written into memory banks 12 as desired.

Figure 3:
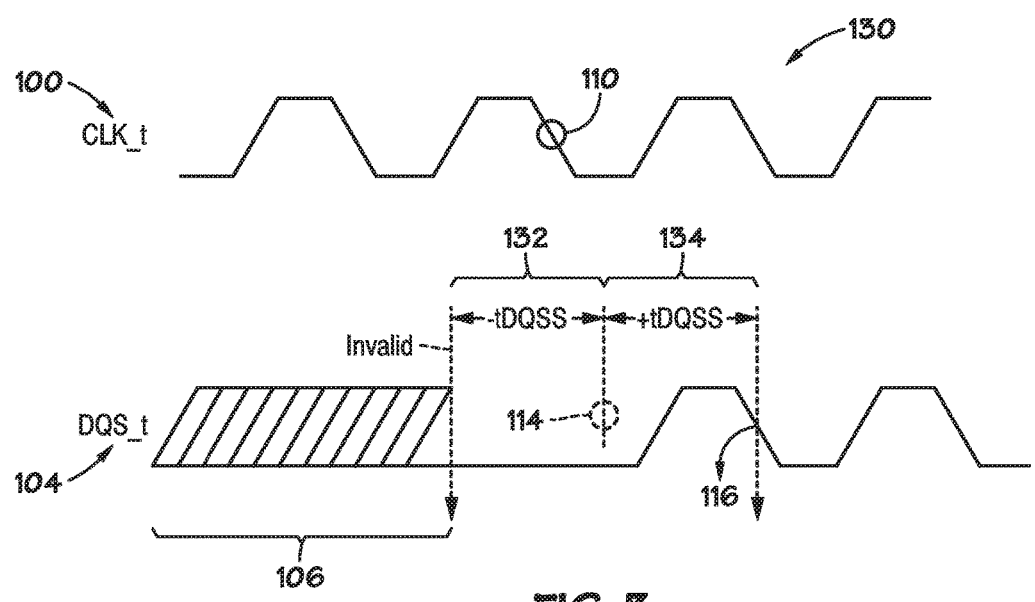
FIG. 3 is a timing diagram illustrating certain timing limits of a CLK-to-DQS phase variance), in accordance with an embodiment.

Turning now to FIG. 3, an example timing diagram 130 illustrating embodiments of a −tDQSS range 132 and a +tDQSS range 134, which may be as small as 0.75 of a clock period for CLK_t 100, is provided. Because the figure uses the same elements as FIG. 2, the same elements are illustrated using the same numbers. In the depicted embodiment, the timing diagram 130 shows the limits of the CLK-to-DQS phase variance that may be possible to achieve desired memory storage operations. tDQSS may be used by certain DDR specifications (e.g., DDR5 specification, DDR4 specification, and so on) to denote the maximum allowed phase difference between CLK and DQS, and may be expressed as a plus/minus percentage of the CLK_t 100 clock period. For WPre=2, the theoretical tDQSS maximum is ±0.75 of the CLK_t 100 clock period as shown in the depicted embodiment.

As can be seen in the diagram 130, if the negative tDQSS maximum (e.g., shown in range 132) is exceeded, then the WrStart 112 rise edge would be found in the invalid region 106 of DQS_t 104, before the preamble. In the invalid region 106, DQS_t 104 is not driven yet. Accordingly, DQS_t 104 could be at a partial level or have falling edge glitches that would capture WrStart 112 prematurely, causing incorrect DRAM operation. If the positive tDQSS maximum (e.g., shown in range 134) is exceeded, then the WrStart 112 rise edge would be to the right of the target falling edge 116 of DQS_t 104, and would therefore be one cycle late, also causing incorrect DRAM operation.

Figure 4:
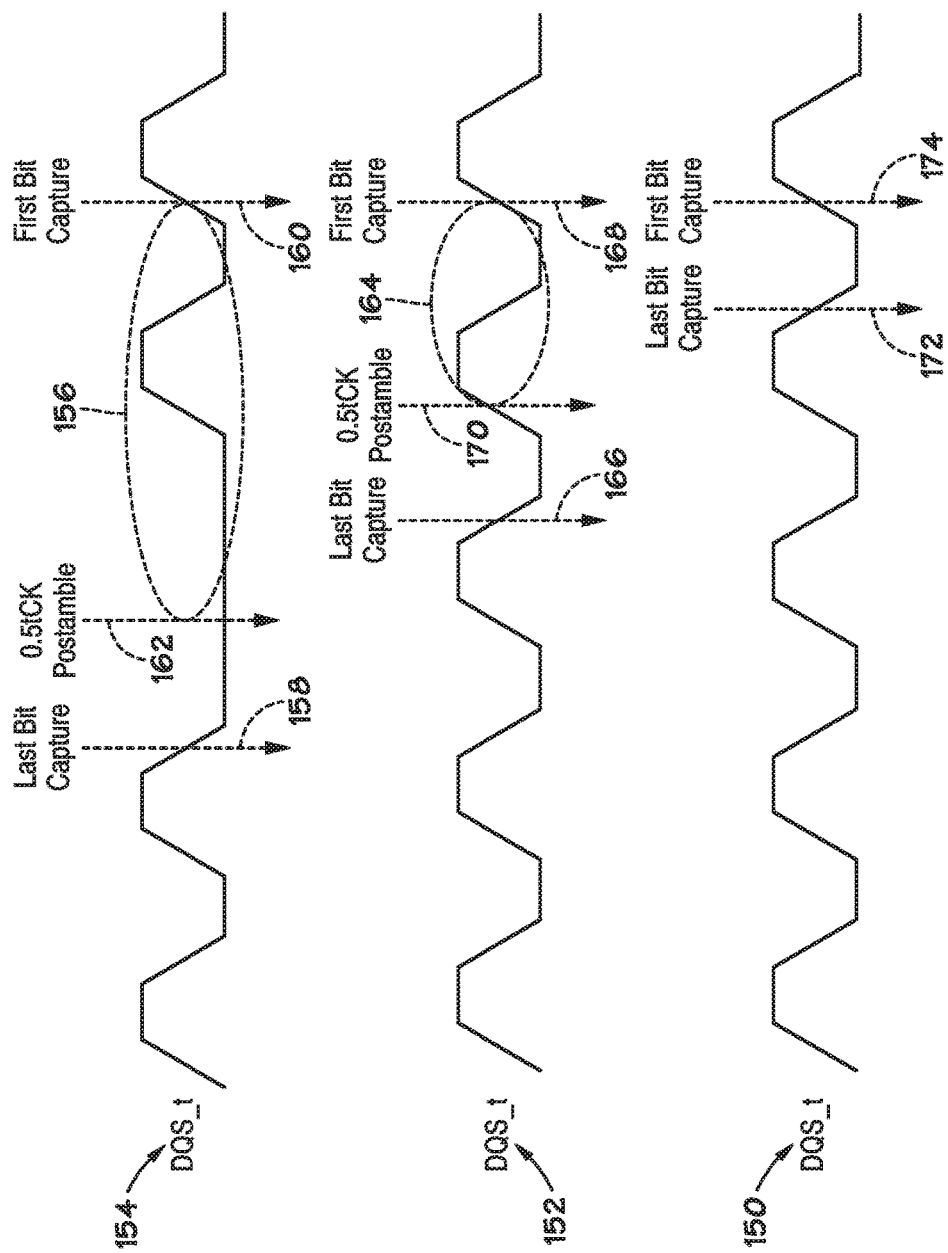
FIG. 4 is a diagram depicting embodiments of a full, a partial, and a no preamble write command, in accordance with an embodiment.

As mentioned earlier, the width of the write preamble sets the maximum tDQSS (CLK-to-DQS phase difference) allowed for correct write operations. It may be beneficial to also illustrate full, partial, and no preamble write command examples, as shown in FIG. 4. More specifically, the figure depicts two example DQS waveforms 150, 152 where write commands are entered so close together that the full preamble (e.g., 2 cycle preamble in the depicted example) is not available, which may lead to incorrect operations. For reference, the figure also depicts a DQS waveform 154 illustrating the case where two consecutive writes have been entered as close together as possible while still allowing for the full write preamble (e.g., WPre=2). That is, the waveform 154 shows a two cycle preamble 156 disposed between a last bit capture time 158 (e.g., time at which the last bit of a previous write was captured) and a first bit capture time 160 (e.g., time at which the first bit of the next write was captured). Additionally, the two cycle preamble 156 begins after a 0.5 time clock postamble 162.

The middle waveform 152 shows a partial preamble case where consecutive writes have been entered so close together that the full preamble is not provided. Instead, only 1 of the 2 programmed cycles of preamble is available, shown as a one cycle partial preamble 164. The one cycle partial preamble 164 fits between a last bit capture time 166 (e.g., time at which the last bit of a previous write was captured) and a first bit capture time 168 (e.g., first bit capture time for next write). Also shown is a 0.5 time clock postamble 170 terminating before the start of the one cycle preamble 164.

The bottom waveform 150 shows a case where two write commands are so close together in time that none of the programmed preamble is provided (i.e., referred to as the "gapless" case). More specifically, a last bit capture time 172 is too close in time (e.g., under a cycle) to a first bit capture time 174 that there may not be enough time for a preamble. Because the full programmed write preamble is not available in the waveforms 150, 152, a window to capture the WrStart 102 from the second write command is minimized. In these waveforms 150, 152, the maximum possible tDQSS would be greatly reduced, and may in fact be a main limiter for the maximum possible phase difference between CLK and DQS.

To avoid reduced tDQSS for gapless and partial preamble cases (e.g., waveforms 150, 152), the techniques described herein may only capture the first WrStart for the first write bursts. Then, counters may be used to count clock cycles between subsequent writes in the clock domain and then track counts of a corresponding number of DQS cycles to begin the subsequent write. Accordingly, the subsequent write is generated internally in the DQS domain instead of externally from the CLK domain.

Figure 5:
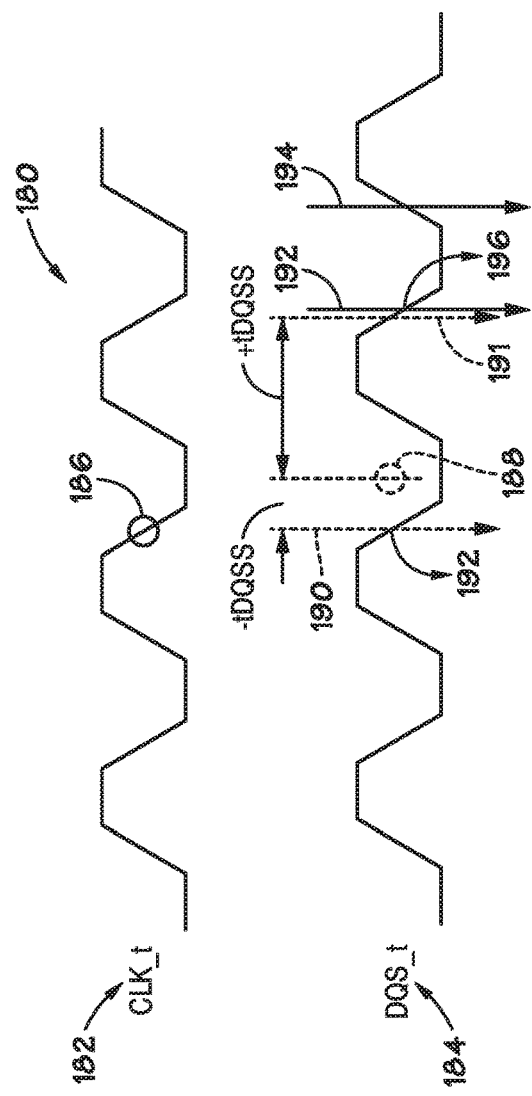
FIG. 5 is a timing diagram depicting a case having embodiments of two waveforms where capturing a falling edge with partial or no preambles may result in incorrect writes.

Turning now to FIG. 5, a timing diagram 180 depicting a case having embodiments of two waveforms 182, 184 where capturing a falling edge with partial or no preambles would result in incorrect writes, is provided. However, the techniques described herein, e.g., generating certain writes internally in the DQS domain after the capture of the first WrStart, may correctly provide for smaller (or no) preamble writes.

In the depicted embodiment, a WrStart 186 may result in a shifted WrCmd 188. The shifted WrCmd 188 is disposed near a tDQSS 190. Also shown is a +tDQSS 191. Traditional techniques may attempt capture of the write command via a falling edge 192. However, because of a lack of a full preamble, as shown by a last bit capture at time 194 and a subsequent first bit capture at time 196, using traditional techniques may result in incorrect writes. To avoid undesired operations for gapless and partial preamble cases, the techniques described herein may instead only capture the first WrStart for the first write burst. Indeed, the first WrStart may be captured and then a DQS fall edge 196 may be used to capture writes and to begin certain counts, as further described below, keeping captures fully in the DQS domain.

Figure 6:
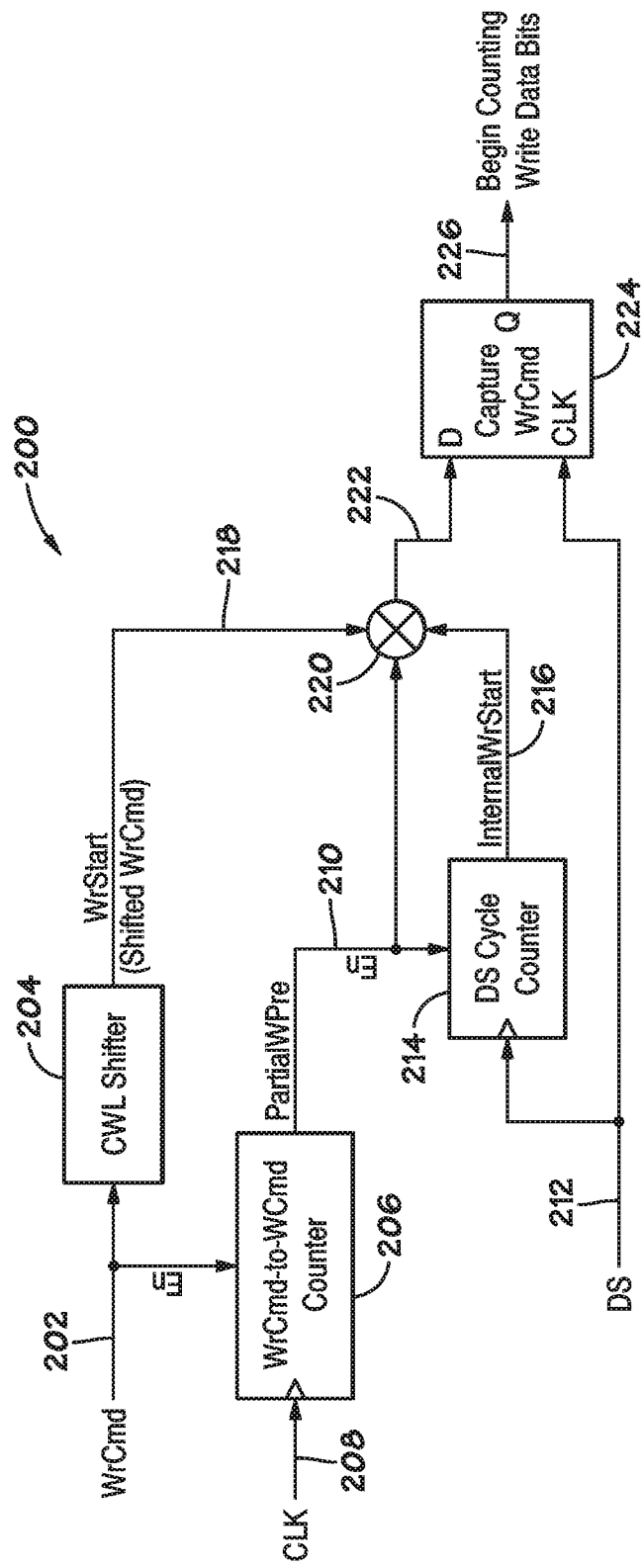
FIG. 6 is a block diagram of an embodiment of a system included in the memory device of FIG. 1 suitable for capturing write data, including write captures with short (or no) preambles, in accordance with an embodiment.

FIG. 6 is a block diagram of an embodiment of a system (e.g., circuitry) 200 suitable for capturing write data, including captures with short (or no) preambles. The system 200 may be included in circuitry of the memory device 10, such as circuitry 50. In the depicted embodiment, a write command (WrCmd) 202 may be shifted in time via a CAS Write Latency (CWL) Shifter 204. The WrCmd 202 may also be provided to a WrCmd-to-WrCmd counter system 206. The WrCmd-to-WrCmd counter system 206 may use as input a clock signal (e.g., CLK_t) 208. If the WrCmd-to-WrCmd counter system 206 determines that a WrCmd count value is small enough that a preamble will be incomplete (or no preamble), then the WrCmd-to-WrCmd counter system 206 will assert a PartialWPre signal 210.

In the DS domain, a DS signal 212 (e.g., DQS_t) may be applied to count the number of PartialWPre signals 210 via a DS cycle counter system 214. Based on the DS signal 212 waveform, a number of internal write start(s) (InternalWrStart) 216 may be produced via the DS cycle counter system 214. All of the internal write start signals 216 are thus in the DQS domain. The InternalWrStart signal 216, the PartialWPre signal 210, and a WrStart (e.g., shifted WrCmd) signal 218 may be combined via a signal combinatory or mixer system 220, to produce a signal 222. The signal 222 may be provided as a logic '1' when all signals 210, 216, and 218 are at a logic '1'. A latch system (e.g. D latch system) 224 may then be used to pass through the signal 222 based on gating the DS signal 212 with DS 212. Accordingly, a capture WrCmd signal 226 may be produced, entirely within the DQS domain after the capture of the first WrStart. Accordingly, write data bits may be captured after the capture WrCmd signal 226 is generated. Indeed, the techniques described herein may, in certain embodiments, capture only one WrCmd externally (i.e., first WrCmd) after power-up of the memory device 10 and then generate all other WrStarts internally in the DQS domain. By keeping subsequent WrStarts in the DQS domain, the issues of phase differences between the CLK and DQS strobes may be minimized or eliminated.

Figure 7:
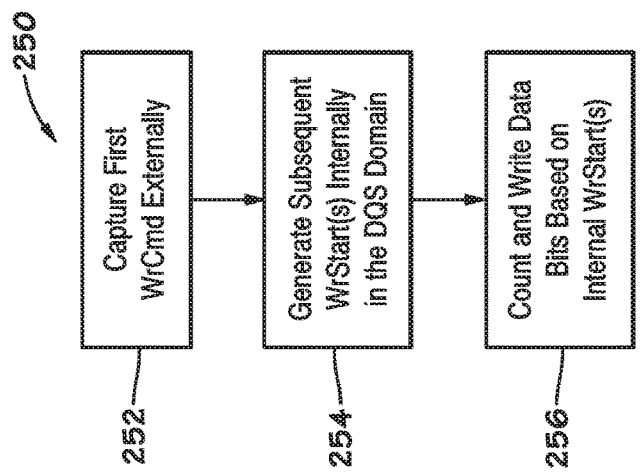
FIG. 7 is a flow chart of a process suitable for writing data into the memory device of FIG. 1 even with partial (or no) write preambles, in accordance with an embodiment.

FIG. 7 is a flow chart depicting an embodiment of a process 250 suitable for writing data into the memory device 10 even with partial (or no) write preambles. The depicted embodiment may be implemented in a variety of circuitry, such as the system 200 described above. In the illustrated embodiment, the process 250 may capture (block 252) a first write command (WrCmd) externally, e.g., using the CLK and DQS waveforms. Once the first write command is captured (block 252), the process 250 may generate (block 254) subsequent write start(s) (WrStart(s)) internally in the DQS domain. For example, the process 250 may use the WrCmd-to-WrCmd counter system 208 to generate a PartialWPre signal 210, and then count an appropriate number of DQS cycles via the DS cycle counter system 214 to generate the internal write start (InternalWrStart) signal 216.

The process 250 may then count and write (block 256) data bits for the internally generated WrStart(s) by, for example, applying the InternalWrStart signal 216, PartialWPre signal 210, and shifted WrCmd 218 to derive the capture WrCmd signal 226, which may be used to capture and write data bits in the DQS domain.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
   data write circuitry configured to:
   capture a first write command received via an external input/output (I/O) interface;
   generate a first internal write start (InternalWrStart) in a data strobe (DQS) domain after capture of the first write command; and
   write a first one or more data bits into at least one memory bank based on the first InternalWrStart, wherein the first InternalWrStart is generated internally in the memory device, wherein the data write circuitry comprises a write command-to-write command counter system comprising at least one counter and counter circuitry to generate a partial write preamble signal (PartialWPre) based on a clock (CLK) waveform and the first write command, and wherein the data write circuitry is configured to use the PartialWPre to generate the first InternalWrStart internally and in the DQS domain.

2. The memory device of claim 1, wherein the data write circuitry comprises a data strobe cycle counter configured to generate the first InternalWrStart based on a data strobe waveform and the PartialWPre, and wherein the data write circuitry is configured to combine the first InternalWrStart, the PartialWPre, and a shifted write command into a combination signal used to write the first one or more data bits into the at least one memory bank.

3. The memory device of claim 2, wherein the data write circuitry comprises a latch system configured to use the combination signal and the data strobe waveform to generate a capture write command signal used to write the first one or more data bits into the at least one memory bank.

4. The memory device of claim 2, wherein the data write circuitry comprises a shifter system configured to phase shift the first write command into the shifted write command.

5. The memory device of claim 1, wherein the data write circuitry is configured to generate a second InternalWrStart in the DQS domain after writing the first one or more data bits, and to apply the second InternalWrStart to write a second one or more data bits.

6. The memory device of claim 1, wherein the data write circuitry is configured to generate all subsequent write starts internally following the first internal write start.

7. The memory device of claim 1, wherein the data write circuitry is configured to the write the first one or more data bits in the presence of a partial write preamble comprising a time window smaller than a full write preamble.

8. The memory device of claim 7, comprising a double data rate type five (DDR5) memory device having the data write circuitry, and wherein the full write preamble comprises a programmable write preamble having 1, 2, 3, or more clock cycles.

9. A method, comprising:

capturing a first write command via a memory device;

generating, via the memory device, a first internal write start (InternalWrStart) in a data strobe (DQS) domain after capture of the first write command; and writing, via the memory device, a first one or more data bits into at least one memory bank based on the first InternalWrStart, wherein the first InternalWrStart is generated internally in the memory device, wherein generating, via the memory device, the first InternalWrStart comprises generating, via a write command-to-write command counter system having at least one counter included in the memory device, a partial write preamble signal (PartialWPre) based on a clock (CLK) waveform and the first write command.

10. The method of claim 9, wherein writing the first one or more data bits into the at least one memory bank comprises combining the first InternalWrStart, the PartialWPre, and a phase shifted write command into a combination signal.

11. The method of claim 10, comprising latching a data strobe waveform via the combination signal to write the first one or more data bits into the at least one memory bank.

12. The method of claim 9, comprising generating a second InternalWrStart in the DQS domain after writing the first one or more data bits, and applying the second InternalWrStart to write a second one or more data bits.

13. The method of claim 9, comprising generating all subsequent write starts internally following the first internal write start.

* * * * *